United States Patent [19]

Suzuki et al.

[11] Patent Number: 5,229,625

[45] Date of Patent: Jul. 20, 1993

[54] SCHOTTKY BARRIER GATE TYPE FIELD EFFECT TRANSISTOR

[75] Inventors: Akira Suzuki, Nara; Katsuki Furukawa, Sakai; Akitsugu Hatano, Tenri; Atsuko Uemoto, Nara, all of Japan

[73] Assignee: Sharp Kabushiki Kaisha, Osaka, Japan

[21] Appl. No.: 764,954

[22] Filed: Sep. 25, 1991

Related U.S. Application Data

[60] Continuation of Ser. No. 416,414, Oct. 3, 1989, abandoned, which is a division of Ser. No. 86,490, Aug. 18, 1987, Pat. No. 4,897,710.

Foreign Application Priority Data

Aug. 18, 1986 [JP] Japan .................. 61-193158

[51] Int. Cl.$^5$ .................. H01L 29/80; H01L 27/095; H01L 29/00; H01L 23/48
[52] U.S. Cl. .................. 257/77; 257/280; 257/472; 257/509; 257/744
[58] Field of Search .................. 357/15, 22, 22 M, 22 J, 357/22 I, 2; 437/100, 911; 257/77, 280, 472, 509, 613, 744

[56] References Cited

U.S. PATENT DOCUMENTS

| | | | |
|---|---|---|---|
| 3,397,448 | 8/1968 | Tucker | 437/100 |
| 3,400,309 | 9/1968 | Doo | 437/100 |
| 3,510,369 | 5/1970 | Ernick et al. | 437/100 |
| 3,571,919 | 3/1971 | Gleim | 437/100 |
| 4,170,818 | 10/1979 | Tobey, Jr. et al. | 357/22 J |
| 4,623,425 | 11/1986 | Suzuki et al. | 257/77 |
| 4,762,806 | 8/1988 | Suzuki et al. | 437/911 |
| 4,897,710 | 1/1990 | Suzuki et al. | 357/2 |

FOREIGN PATENT DOCUMENTS

| | | | |
|---|---|---|---|
| 0676663 | 12/1963 | Canada | 437/100 |
| 54-133086 | 10/1979 | Japan | 437/100 |
| 60-113435 | 6/1985 | Japan | 437/100 |
| 61-81873 | 4/1986 | Japan | 357/22 |

OTHER PUBLICATIONS

IBM Technical Disclosure Bulletin, "Integrated semiconductor structure arrangement", Phillips et al, vol. 8, No. 7, Dec. 1985.

Chapter 9 from Semiconductors and Semimetals entitled "Silicon Carbide Junction Devices" by Albert C. Beer, vol. 7; pp. 625–683.

Articles from J. Appl. Phys. Oct. 15, 1986 entitled "Schottky-Barrier Field-Effect Transistors of 3C-SiC", Daimon et al., pp. 2989 to 2991.

"A New Doping Method Using Metalorganics in Chemical Vapor Deposition 6H-SiC" by S. Yoshida et al., Journal of Applied Physics 55 (1), Jan. 1, 1984 pp. 169-171.

"High Temperature Electrical Properties of 3C-SiC Epitaxial Layers Grown By Chemical Vapor Deposition" by K. Sasaki et al., Applied Physics Letters 45 (1) Jul. 1, 1984, pp. 72-73.

*Primary Examiner*—Rolf Hille
*Assistant Examiner*—Steven Loke

[57] ABSTRACT

The semiconductor device somprises a silicon substrate, a boron-doped high resistant silicon carbide layer formed on said silicon substrate and a silicon carbide layer formed on said high resistant silicon carbide layer.

4 Claims, 2 Drawing Sheets

SCHOTTKY BARRIER GATE TYPE FIELD EFFECT TRANSISTOR

This application is a continuation of application Ser. No. 07/416,414 filed on Oct. 3, 1989, now abandoned, which is a divisional of copending application Ser. No. 07/086,490, filed on Aug. 18, 1987 now U.S. Pat. No. 4,897,710.

BACKGROUND OF THE INVENTION

This invention relates to a silicon carbide (SiC) semiconductor device, more particularly to a silicon carbide semiconductor device forming a high resistant silicon carbide single crystal layer on a silicon single crystal substrate.

Semiconductor devices including diodes, transistors, integrated circuits (ICs), large scale integration (LSI) circuits, light emitting diodes, semiconductor lasers, charge coupled devices (CCDs) that are, made of silicon (Si) and compound semiconductor materials such as, gallium arsenide (GaAs) and gallium phosphide (GaP), are widely used in the fields of electronics. A silicon carbide semiconductor, meanwhile, has such features among others, as a wider forbidden energy gap (2.2 to 3.3 eV) than the semiconductor materials stated above, and thermal, chemical of mechanical stabilities and great resistance to radiation damage. Accordingly semiconductor devices employing silicon carbide can be used in severe conditions including high temperature, large amounts of electric power, exposure to radiation and other conditions where devices made of other semiconductor materials cannot be used. The silicon carbide devices are expected to be applied in a wide range of fields where semiconductor devices having a high amount of reliability and stability are necessary.

The reason why the silicon carbide semiconductor device has not yet been in practical use, despite expectation from various fields, is since the delay of the establishment of crystal growing techniques to obtain a high-quality and large-scale silicon carbide single crystal that are required in the mass production at an industrial scale where the productivity is important. Conventionally, diodes and transistors have been produced in a laboratory environment using silicon carbide single crystal grown by a sublimation-recrystallization method (called Lely method) or a silicon carbide single crystal layer epitaxially chemical vapor deposition process, a liquid phase epitaxy process or a similar process to the single crystal. This technique was reported by R. B. Campbell and H-C Chang as "Silicon Carbide Junction Devices," in "Semiconductors and Semimetals," eds. R. K. Williardson and A. C. Beer (Academic Press, N.Y., 1971) vol. 7 Past B. Chap 9 pp. 625 to 683. By this technique, however, only a small area of single crystal could be produced, and it was hard to control the dimension and shape of the single crystal area. Moreover, it was not easy to control a crystal polytype and the concentration of impurities existing in the silicon carbide crystal. Therefore, the technique for producing a semiconductor device by using silicon carbide was far short of the practical manufacturing method necessary at an industrial scale.

The present inventors have previously proposed a method for growing a high quality and large area of silicon carbide single crystal on a silicon single crystal substrate by a chemical vapor deposition method (CVD method). For example, this method is disclosed in U.S. Pat. No. 4,623,425, issued on Nov. 18, 1986, entitled "Method of Fabricating Single-Crystal Substrates of Silicon Carbide," by Akira Suzuki et al.

This method comprises the steps of forming a silicon carbide thin layer on a silicon single crystal substrate by a low-temperature CVD method and subsequently raising the temperature for growing silicon carbide single crystal by a CVD method. Thus a high quality silicon carbide single crystal layer having a large area in which the crystal polytype concentration of impurities, the dimensions, the shape and other factors controlled can be supplied by using a low-cost and easily obtainable silicon single crystal substrate. Furthermore, this manufacturing method is suitable for a mass production system and will provide high productivity. A semiconductor device using a silicon carbide single crystal layer produced on a silicon single crystal substrate in such a way has poor electrical insulation between the active device layer and the underlaying layer, so that preferable characteristics could not be obtained.

SUMMARY OF THE INVENTION

In order to solve the above-mentioned problems, it is a primary object of this invention to present a semiconductor device produced by forming both a boron-doped high resistant silicon carbide layer on a silicon substrate, and another silicon carbide layer on the boron-doped high resistant silicon carbide layer.

It is another object of this invention to provide an electrically isolated semiconductor device by forming a silicon carbide single crystal layer on a boron(B)-doped semi-insulated high resistant silicon carbide single crystal.

Other objects and further scope of the applicability of the present invention will become apparent from the detailed description given hereinafter. It should be understood however, that the detailed description and specific examples, while indicating preferred embodiments of the invention, are given by way of illustration only, since various changes and modification within the spirit and scope of the invention will become apparent to those skilled in the art from this detailed description.

To achieve the above objects, according to an embodiment of the present invention, a semiconductor device comprises a silicon substrate, a boron-doped high resistant silicon carbide layer formed on the silicon substrate and a silicon carbide layer formed on the high resistant silicon carbide layer.

BRIEF DESCRIPTION OF THE DRAWINGS

The embodiments of the present invention will become more fully understood from the detailed description given hereinbelow and the accompanying drawings which are given by way of illustration only, and thus are not limitative of the present invention and wherein.

DETAILED DESCRIPTION OF THE EMBODIMENTS OF THE PRESENT INVENTION

A variety of semiconductor devices are explained hereinafter in which the embodiments of the invention are applied. The basic construction of the devices is formed by a boron-doped high resistant silicon carbide layer on a silicon substrate which is followed by forming another silicon carbide layer on the high resistant silicon carbide layer.

The boron-doped high resistant silicon carbide single crystal layer is produced when a single crystal layer of silicon carbide is deposited on a silicon substrate by supplying a material gas composed of monosilane ($SiH_4$) and propane ($C_3H_8$). At this time, diborane ($B_2H_6$) is fed as an impurity gas, and boron is added in a silicon carbide single crystal layer as an impurity. Boron is an element with an extremely small atomic radius, and is introduced in the silicon carbide single crystal layer as an interstitial atom in most cases and the boron acts as point defects which distort the crystallattice of silicon carbide. Accordingly, the electric resistance of silicon carbide increases corresponding to the concentration at which boron is introduced.

When producing a variety of semiconductor devices such as a plurality of diodes and transistors on a high resistant single crystal layer of silicon carbide obtained in such a way, devices are stably isolated from each other by a high insulation characteristic of silicon carbide.

Figure 1:
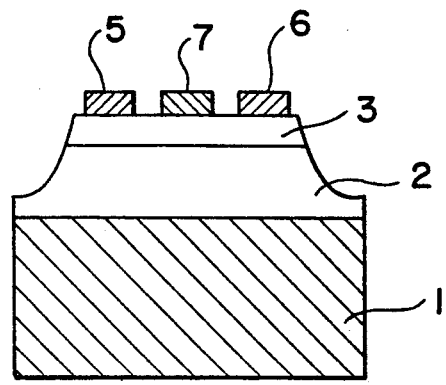
FIG. 1 is a sectional view of a Schottky barrier gate type field effect transistor which is a semiconductor device of a first embodiment of this invention.

1) Schottky barrier gate type field effect transistors:

FIG. 1 is a drawing of a silicon carbide transistor showing one embodiment of this invention. On a silicon single crystal substrate 1, a boron-doped high resistant silicon carbide single crystal layer 2 (resistivity 100 $\Omega$cm or more) is deposited to in a thickness of about 5 $\mu$m by a CVD method. On the high resistant silicon carbide single crystal layer 2a, non-doped n-type silicon carbide single crystal layer 3 of about 0.5 $\mu$m in thickness is superposed as a channel layer by a CVD method. Next, nickel (Ni) is evaporated on the channel layer 3, so that an ohmic electrode is produced and patterned as a source electrode 5 and drain electrode 6.

Sequentially, gold (Au) of the Schottky electrode is evaporated as a gate electrode 7 between the source electrode 5 and the drain electrode 6 to make a Schottky barrier gate type field effect transistor. In a case of supplying a current on the source electrode 5 and taking out the current at the drain electrode 6, the current flowing in the area of channel layer 3 between the source electrode 5 and the drain electrode 6 can be controlled by the voltage applied on the gate electrode 7 and thus the transistor characteristics can be obtained.

In such a way as stated above, electric isolation is carried out by forming a silicon carbide single crystal layer on a boron(B)-doped semi-insulated high resistant silicon carbide single crystal.

Figure 2:
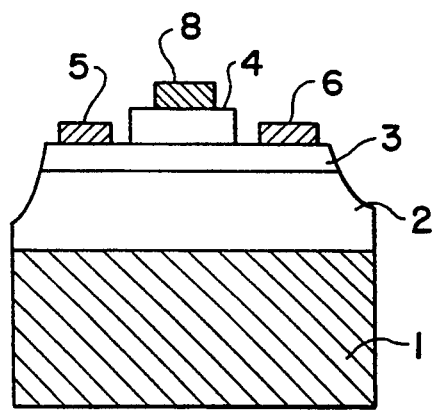
FIG. 2 is a sectional view of a p-n junction gate type field effect transistor which is a semiconductor device of a second embodiment of this invention.

2) P-n junction gate type field effect transistors:

FIG. 2 is a drawing of a silicon carbide transistor showing another embodiment of this invention. A boron-doped high resistant silicon carbide single crystal layer 2 (resistivity is 100 $\Omega$cm or more) is deposited on a silicon single crystal substrate 1 in to a thickness of approximately 5 $\mu$m by a CVD method in the same way as in FIG. 1. A non-doped n-type silicon carbide single crystal layer 3 of approximately 0.5 $\mu$m in thickness is superposed as a channel layer on the high resistant silicon carbide single crystal 2 by a CVD method. Furthermore, a p-type silicon carbide single crystal layer 4, which has aluminum added, is also superposed by a CVD method to a thickness of about 3 $\mu$m.

Then, both sides of the p-type silicon carbide single crystal layer 4 are removed to expose the n-type silicon carbide single crystal layer 3. Nickel is evaporated on the p-type silicon carbide single crystal layer 4 as an ohmic electrode, and a source electrode 5 and a drain electrode 6 on the nickel layer. On the other hand, an aluminum-silicon (Al-Si) alloy, which becomes an ohmic electrode for the p-type silicon carbide single crystal layer 4, is evaporated as a gate electrode 8.

The current flowing through the channel layer 3 between the source electrode 5 and the drain electrode 6 can be controlled in the same way as in FIG. 1 by the voltage applied to the gate electrode. Thus, transistor characterististics are obtained.

3) Resistor

Figure 3:
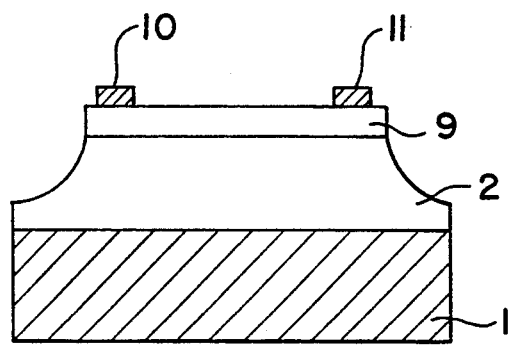
FIG. 3 is a sectional view of a resistor which is a semiconductor device of a third embodiment of this invention.

FIG. 3 is a drawing of a resistor showing a further embodiment of this invention. A boron-doped high resistant silicon carbide single crystal layer 2 (resistivity is 100 $\Omega$cm or more) is deposited on a silicon single crystal substrate 1 to a thickness of about 5 $\mu$m by the CVD method. A nitrogen-doped n-type silicon carbide single crystal layer 9, which has its resistivity controlled, is formed on the high resistant silicon carbide single crystal layer 2 as a resistant layer to a thickness of about 1 $\mu$m by the CVD method.

For the purpose of resistivity control, the amount of the nitrogen donor being doped is controlled. Then, nickel (Ni) is evaporated on the resistant layer 9 as ohmic electrodes 10 and 11. The space between electrodes 10 and 11 becomes a resistor that is determined by the resistivity of the resistant layer 9, the interval between the electrodes and the thickness and the width of the resistant layer 9.

4) Capacitor

Figure 4:
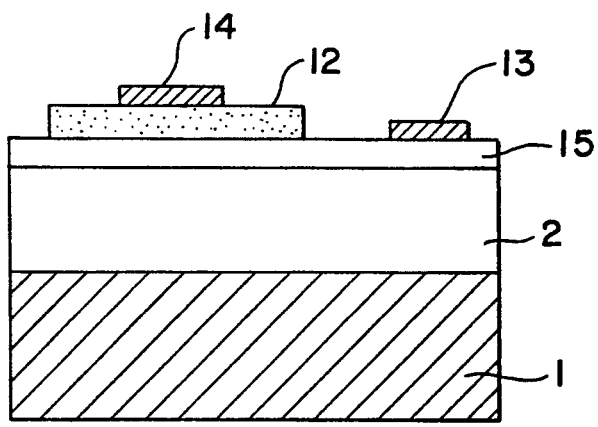
FIG. 4 is a sectional view of a capacitor which is a semiconductor device of a fourth embodiment of this invention.

FIG. 4 is a drawing of a capacitor showing still another embodiment of this invention.

A boron-doped high resistant silicon carbide single crystal layer 2 (its resistivity is 100 $\Omega$cm or more) is deposited on a silicon single crystal substrate 1 to a thickness of about 5 $\mu$m by the CVD method. A nitrogen-doped low resistant n-type silicon carbide single crystal layer 15 (its resistivity is, for example, 0.1 $\Omega$cm or less) is formed on the high resistant silicon carbide single crystal layer 2 to a thickness of about 1 $\mu$m by the CVD method. Sequentially, the surface of single crystal is coated with an oxide layer (10 nm to 200 nm in thickness) by thermal oxidization process in an oxygen atmosphere at a temperature of about 1000° C. A part of the oxide layer 12 is removed by etching so that an ohmic electrode (Ni) 13, and a capacitor electrode (Al) 14 are formed on the oxide layer 12. The space between the electrodes 13 and 14 becomes a capacitor determined by the thickness of the oxide layer and the area of the electrode.

A Schottky barrier gate type field effect transistor and a p-n junction gate type field effect transistor are explained in the embodiments herein, but field effect transistors of other instructions may be processed including insulated gate type. Also, other devices, such as diodes, may be formed in further embodiments of this invention.

According to this invention, the characteristics of a semiconductor device using a silicon carbide single crystal layer can be widely improved, which cultivate for a broad range of application fields of silicon carbide semiconductors that have superior characteristics not found in other semiconductor devices made of silicon or similar materials.

In the embodiments of this invention, electrical isolation is performed by forming a silicon carbide single crystal layer on a boron(B)-doped semi-insulated high resistant silicon carbide single crystal layer.

While only certain embodiments of the present invention have been described, it will be apparent to those skilled in the art that various changes and modifications may be made therein without departing from the spirit and scope of the present invention as claimed.

We claim:

1. A structure for a Schottky-barrier gate type FET semiconductor device comprising:

a single crystal silicon substrate;

a first high resistant single crystal silicon carbide layer being boron-doped and disposed on said single crystal silicon substrate, said first high resistant single crystal silicon carbide layer comprising a resistivity of greater than 100 $\Omega$cm;

a second silicon carbide layer disposed on said first high resistant single crystal silicon carbide layer for forming an active layer of the semiconductor device, wherein said second silicon carbide layer is electrically insulated from said single crystal silicon substrate by said first high resistant single crystal silicon carbide layer;

a first electrode layer disposed on a first portion of said second silicon carbide layer;

a source electrode formed from a first portion of said first electrode layer;

a drain electrode formed from a second portion of said first electrode layer; and a second electrode layer disposed on a second portion of said second silicon carbide layer for forming a gate electrode.

2. A structure as set forth in claim 1, wherein said first electrode layer comprises Ni.

3. A structure as set forth in claim 1, wherein said second electrode layer comprises Au.

4. A structure as set forth in claim 1, wherein said second silicon carbide layer comprises n-type single crystal silicon carbide.

* * * * *